US010871508B1

(12) United States Patent
Roberts et al.

(10) Patent No.: US 10,871,508 B1
(45) Date of Patent: Dec. 22, 2020

(54) NONLINEAR TRANSMISSION LINE (NLTL)-BASED MINIATURE REFLECTOMETERS WITH REDUCED HEAT DISSIPATION AND SCALABLE TETHER LENGTH

(71) Applicant: ANRITSU COMPANY, Morgan Hill, CA (US)

(72) Inventors: Thomas Roberts, Morgan Hill, CA (US); Karam Noujeim, Los Altos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 31 days.

(21) Appl. No.: 16/024,788

(22) Filed: Jun. 30, 2018

Related U.S. Application Data

(60) Provisional application No. 62/527,954, filed on Jun. 30, 2017.

(51) Int. Cl.
  *G01R 1/24* (2006.01)
  *G01R 23/20* (2006.01)
  *G01R 1/04* (2006.01)
  *G01R 27/06* (2006.01)

(52) U.S. Cl.
  CPC .............. *G01R 1/24* (2013.01); *G01R 1/0416* (2013.01); *G01R 23/20* (2013.01); *G01R 27/06* (2013.01)

(58) Field of Classification Search
  CPC ........ G01R 19/17; G01R 27/26; G01R 27/28; G01R 27/32; G01R 31/28; G01R 31/2822; G01R 31/2851; G01R 31/319
  See application file for complete search history.

(56) References Cited

U.S. PATENT DOCUMENTS

| 2006/0250135 | A1  | 11/2006 | Buchwald |
| 2011/0037667 | A1  | 2/2011  | Varjonen |
| 2011/0304318 | A1* | 12/2011 | Noujeim ................ G01R 27/32 324/76.24 |
| 2016/0050032 | A1  | 2/2016  | Emerson |

(Continued)

OTHER PUBLICATIONS

"71-76 GHz Millimeter-wave Transceiver System, Revision: 1.2", National Instruments, 2015, 11 pages.

(Continued)

*Primary Examiner* — Son T Le
(74) *Attorney, Agent, or Firm* — Tucker Ellis LLP (57) ABSTRACT

A system for measuring an electrical response of a device under test (DUT) includes a reflectometer with reduced heat dissipation used with a vector network analyzer (VNA). The reflectometer is tethered to the VNA using a tether of scalable length which carries low frequencies. The reflectometer has a distributed harmonic generator including a non-linear transmission line (NLTL) for multiplying a frequency of an RF signal received from the VNA to generate a test signal having a frequency in the millimeter wave range at a test port connected to the DUT. A sampler in the reflectometer receives a local oscillator (LO) signal from the VNA and includes another NLTL for receiving the LO signal and generating pulses at a frequency in the millimeter wave range. When the test signal is transmitted to the DUT, the sampler outputs intermediate frequency signals which are transmitted to the VNA for characterization of the DUT.

15 Claims, 5 Drawing Sheets

(56) References Cited

U.S. PATENT DOCUMENTS

2017/0153280 A1* 6/2017 Mikulka ............... G01R 27/28

OTHER PUBLICATIONS

"802.11ad Integrated RF Test Solution—Data Sheet", Keysight Technologies, published Feb. 3, 2017, 13 pages.

"Cobaltfx mm-Wave VNA Test & Measurement Solution", Farran Technology, http://www.farran.com/shop/fev_fx/, 5 pages.

Noujeim, et al. "Reduced-Complexity E-Band VNAs with Tethered Far-Reaching Reflectometers", Proceedings of the 46th European Microwave Conference, Oct. 4-6, 2016, 4 pages.

Roberts, et al. "A Compact, Tethered E-Band VNA Reflectometer", 2016 IEEE MTT-S International Microwave Symposium (IMS), May 22-27, 2016, 3 pages.

"Vector Network Analyzer Extenders", http://vadiodes.com/en/products/vector-network-analyzer-extension-modules, 7 pages.

"VectorStar Broadband VNA: ME7838A/E/D", Anritsu Company, https://www.anritsu.com/en-US/test-measurement/products/me7838a, 3 pages.

"VNA Extension Modules", https://www.omlinc.com/products/vna-extension-modules, 2016, 3 pages.

Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.

Cunha, Telmo R. et al., "Characterizing Power Amplifier Static AM/PM with Spectrum Analyzer Measurements", IEEE © 2014, 4 pages.

Fager, Christian et al., "Prediction of Smart Antenna Transmitter Characteristics Using a New Behavioral Modeling Approach" IEEE® 2014, 4 pages.

Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.

Martens, J. et al., "Towards Faster, Swept, Time-Coherent Transient Network Analyzer Measurements" 86th ARFTG Conf. Dig., Dec. 2015, 4 pages.

Martens, J., "Match correction and linearity effects on wide-bandwidth modulated AM-AM and AM-PM measurements" 2016 EuMW Conf. Dig., Oct. 2016, 4 pages.

Nopchinda, Dhecha et al., "Emulation of Array Coupling Influence on RF Power Amplifiers in a Measurement Setup", IEEE © 2016, 4 pages.

Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.

Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.

Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.

Rusek, Fredrik et al., "Scaling Up MIMO; Opportunities and challenges with very large arrays", IEEE Signal Processing Magazine, Jan. 2013, pp. 40-60.

Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.

Senic, Damir et al., "Radiated Power Based on Wave Parameters at Millimeter-wave Frequencies for Integrated Wireless Devices", IEEE © 2016, 4 pages.

* cited by examiner

NONLINEAR TRANSMISSION LINE (NLTL)-BASED MINIATURE REFLECTOMETERS WITH REDUCED HEAT DISSIPATION AND SCALABLE TETHER LENGTH

CLAIM OF PRIORITY

This application claims the benefit of priority to U.S. Provisional Application titled "NONLINEAR TRANSMISSION LINE (NLTL)-BASED MINIATURE REFLECTOMETERS WITH REDUCED HEAT DISSIPATION AND SCALABLE TETHER LENGTH", Application No. 62/527,954, filed Jun. 30, 2017, which application is herein incorporated by reference.

TECHNICAL FIELD

The present invention relates generally to systems, devices and methods for measuring an electrical response of a device under test (DUT) to test signals.

BACKGROUND

Signal frequencies in the millimeter (mm)-wave spectrum (e.g. V Band, E Band, W Band, etc.) have been in use in military applications as well as a growing number of consumer applications. For example, automotive electronic safety systems, such as collision-avoidance radar systems operate at frequencies from the mm-wave spectrum. Further, the allocation of mm-wave bands for upcoming fifth-generation (5G) cellular wireless communications systems is expected to vastly increase the use of available wide bandwidths in support of communications and entertainment services to be offered to consumers by service providers. Testing these higher-frequency mm-wave frequency systems requires suitable test equipment, including network analyzers with not only sufficient frequency range but also sufficient acquisition bandwidth.

Current solutions for network analyzer measurements at mm-wave frequencies rely on mm-wave extension modules (also known as extension heads or frequency extenders) based on precision-machined, split-block, rectangular waveguide and coaxial components connected together to form a one-port reflectometer. They are typically bulky, heavy, unwieldy and expensive due to the waveguide nature of the various components and the precision machining and assembly that are required. They are often also complex, limited in physical reach, dissipate excessive heat and lack long-term thermal stability. These characteristics lead to challenges in the positioning of modules for certain applications, including for example on-wafer measurements, often necessitating the use of long test-port extenders to connect the modules to a device under test (DUT), thus negatively impacting system performance (e.g. directivity, port power).

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Figure 1:
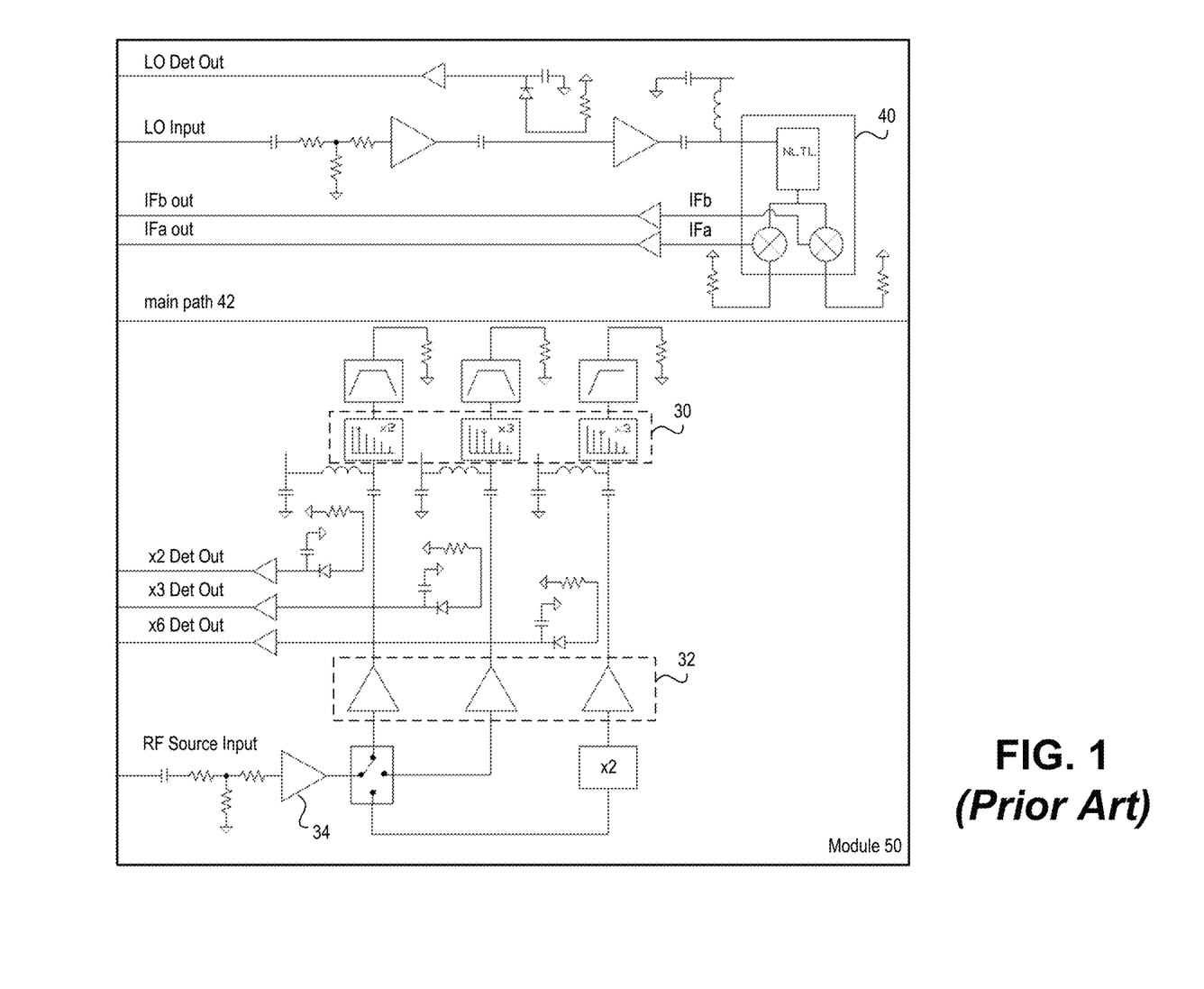
FIG. 1 illustrates a circuit diagram of a module for use with a measuring instrument to measure the electrical response of a DUT to test signals, in accordance with the prior art.

FIG. 1 is a circuit diagram of a module 50 for use with measuring instruments to measure an electrical response of a device under test (DUT) to test signals having frequencies in the mm-wave spectrum range, in accordance with the prior art. The module is a broadband module comprising multiple source chains (three, as shown) for propagating radio frequency (RF) signals received from a measuring instrument (such as a vector network analyzer (VNA)) within separate, narrower bands through the module for transmission to the DUT via a main signal path. The source chains each include multipliers 30 to generate test signals in the mm-wave range that are selectively coupled to the main path.

As can be seen, a non-linear transmission line (NLTL)-based sampler 40 samples the test signals propagating along the main path, as well as reflected signals from the DUT returning along the main path. Any transmitted signals from a second module connected with the DUT will also be coupled to the sampler. Sampled RF signals are mixed with a signal generated from a local oscillator (LO) input signal also received from the measuring instrument and propagated through the NLTL to generate intermediate frequency (IF) signals IFa, IFb which are transmitted back to the measuring instrument for DUT response measurement. The LO input is filtered and amplified to eliminate noise and increase signal strength.

Each source chain operates over its own frequency band. As shown, there are three bands comprising ×2, ×3 and ×6 multiplication of a source signal, with the ×6 band formed by a cascaded connection of a ×2 and ×3 multiplier. As an example, the ×2 output (at the coupler) may operate over a frequency band that spans 50-80 GHz, the ×3 may operate in a frequency band that spans 80-110 GHz and the ×6 may operate in a frequency band that spans 110-140 GHz. Only one of the source paths is active at a time. As the instrument sweeps in frequency, the source chains independently couples (i.e. multiplexes) the source signal onto the main path to derive a broadband source at the test port.

RF signals received from a measuring instrument, such as a VNA, lose power when transmitted from the measuring instrument to the module along a transmission line. Further, signals inherently lose power when the signals are coupled from the source chain to the main path. The received signal must therefore be amplified to achieve the highest available power and dynamic range at the test port. Power amplifiers 32 that amplify signals before the signals are input to the multipliers maximize available power at the test port. However, power amplifiers are band limited, and each amplifier is selected for its specific band to maximize power to the multiplier and multiplied output power to the test port.

Because RF signals received at the module lose power when transmitted from the measuring instrument to the module along a transmission line, such signals are typically limited to transmission over transmission lines having lengths no greater than about 1 meter. The amplifier for each of the source chains is typically high power to compensate for the signal loss along the transmission line, as well as to compensate the inherent loss that results from coupling the source chain to the main path. These high power amplifiers are very heat dissipative and as a result generate large amounts of heat within the module. Such modules as shown in FIG. 1 therefore exhibit the drawbacks described above, including being limited in physical reach, dissipating excessive heat and lacking long-term thermal stability.

Figures 2A, 2C:
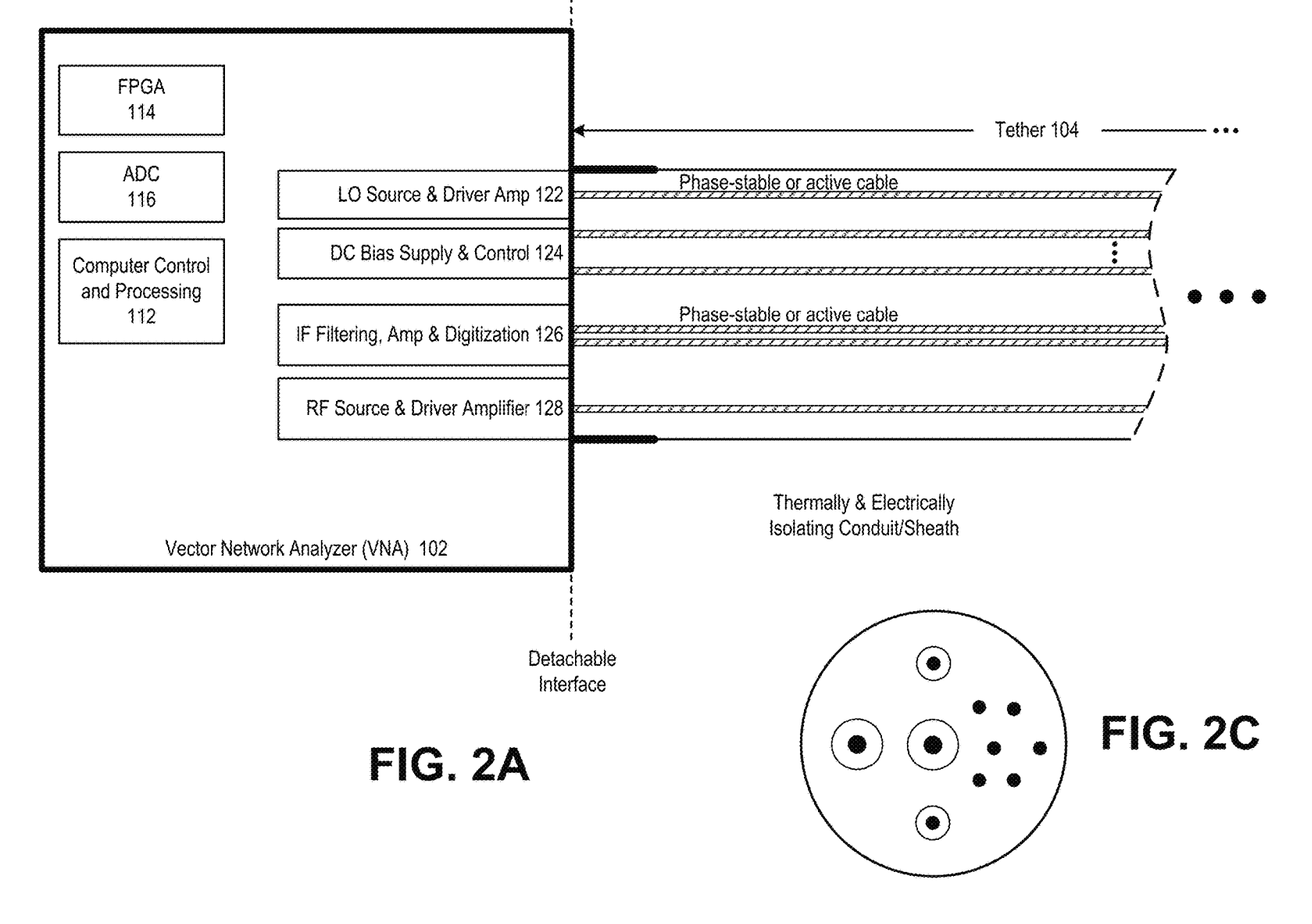
FIGS. 2A and 2B illustrate a circuit diagram of a module connected with a measuring instrument for use in measuring the electrical response of a DUT to test signals, in accordance with an embodiment.
FIG. 2C is an example of a cross-section of a tether for connecting transmission lines from a base measuring instrument to the module of FIGS. 2A and 2B, in accordance with the present invention.
Figure 2B:
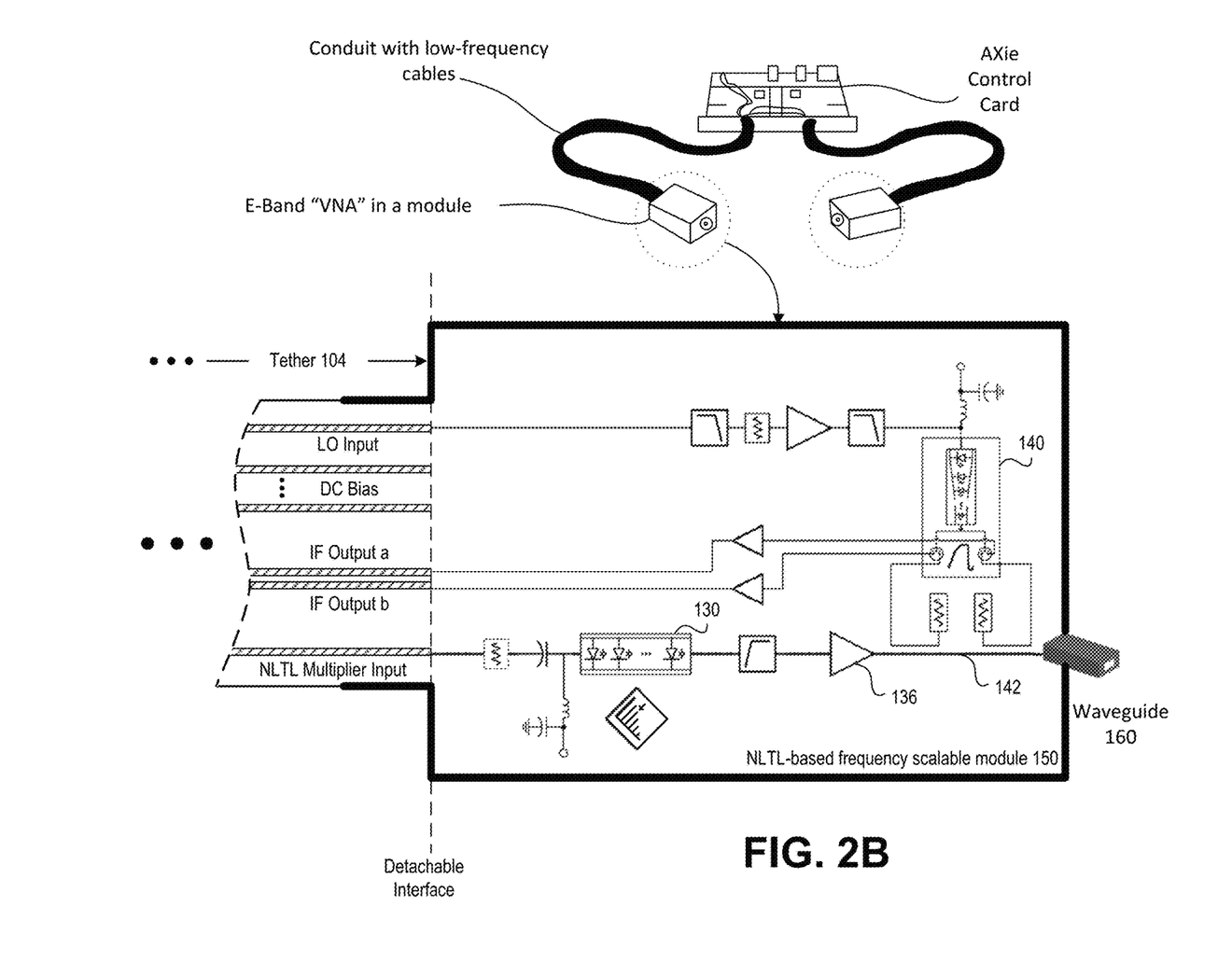

FIGS. 2A-2C illustrate a system for measuring an electrical response of a DUT to test signals in the mm-wave spectrum range, in accordance with an embodiment of the present invention. The system comprises a measuring instrument, which as illustrated is a VNA 102, and a module 150 (also referred to herein as a reflectometer) connected with the VNA via a tether 104. Network analyzers are often used to characterize two-port networks such as amplifiers and filters, but they can be used on networks with an arbitrary number of ports.

Referring to FIG. 2A, the VNA includes a components for generating test signals and measuring signals received in response to the test signals, including a field-programmable gate array (FPGA), an analog-to-digital converter (ADC), and computer control and processing 112 circuitry. The VNA further includes components for supplying and controlling DC bias 124, components for generating signals used for measurement tests, including LO signals 122 and RF test signals 128, and components for amplifying, filtering and digitizing IF signals 126.

Signals including DC bias, LO, RF and IF signals are transmitted between the VNA and the module via the tether. For reasons described further below, the tether can be of a scalable length, rather than the limited length usable with the module of FIG. 1, and is connected between the VNA and the module at detachable interfaces of the respective components of the system. In accordance with an embodiment, the tether can extend a length of five meters or more, with a typical range being between one meter and five meters. Within the tether are a plurality of low loss cables comprising transmission lines for the individual signals transmitted between the VNA and the module. As shown in FIG. 2C, the cables can be, for example, coaxial cables distributed throughout the tether and having different diameters and constructions, depending on the characteristics of the signal transmitted therethrough. Tether (and thus cable) length can depend, for example, on the power of the signals transmitted through the cables and signal loss along the length, which loss can depend on the frequency of the signals (lower frequency signals suffer less loss).

In accordance with an embodiment, at least the coaxial cables transmitting RF signals within the tether are insulated and ruggedized, having a conduit sheathing the cables. At least some of the cables can comprise phase-stable or active cables. The construction of the tether is such as to provide thermal and electrical insulation. In a further embodiment, the cables can include a flexible conduit called a square lock tube (also referred to as a square lock casing) that surrounds the cables and has a crush resistance property as well as a minimum bend radius property that prevents cable damage.

Referring to FIG. 2B, in accordance with an embodiment, a module uses nonlinear transmission line (NLTL)-based directional sampling bridges and harmonic generators to miniaturize the reflectometer module while maintaining its electrical performance, size, and heat dissipation nearly constant irrespective of tether length. Such a module is used, for example, in the MS46522B Option VNA available from Anritsu Company and can optionally be used in potential original equipment manufacturer (OEM) systems and other solutions. In accordance with an embodiment, tethered modules can be connected directly to a DUT. Directly connecting the DUT to the tethered module eliminates the need to test port cables. In this configuration, the reflectometer is positioned as close to the DUT as possible, thereby increasing measurement stability. The module can be used with a VNA to extend a frequency range of the VNA to cover E-band and major parts of V-Band.

As illustrated, the module includes a signal source that propagates a test signal received from the VNA along a main signal path 142 that includes a shockline comprising a distributed harmonic generator 130 arranged thereon, and which is connected with a test port 160. As an example, the port can comprise a waveguide, such as a WR-12 standard waveguide designed for signals within a frequency range of 60-90 GHz. The distributed harmonic generator circuit can comprise a NLTL embodied as a microchip.

In accordance with an embodiment, the module does not include a power amplifier for amplifying the RF signal received from the VNA prior to propagating to the distributed harmonic generator. The resulting, mm-wave frequency test signal may be filtered and amplified prior to propagating to the test port by a power amplifier 136, however such an amplifier is much lower power than the amplifiers of source chain amplifiers of FIG. 1, and therefore much less heat dissipative. Further, the RF signal received from the VNA is multiplied and propagated along the main signal path to the test port without having to couple the signal to the main signal path, thereby reducing power loss associated with coupling. The result is reduced circuitry and lower weight and bulk, with much lower heat dissipation, thus allowing for a more compact design. However, as will be appreciated, the module is a band-limited module, operating over a single, narrow band rather than operating as a broadband device. The module further includes a harmonic sampler 140 for generating IF signals from an LO input and RF signals coupled to the harmonic sampler.

The LO signal source provides a LO input to the frequency scalable, NLTL-based sampler. In an embodiment, the LO signal can comprise a square wave. The NLTL multiplies the frequency of the LO signal to mm-wave frequencies. The output of the NLTL is connected with an RF input, for example a signal received from a DUT. The output of the NLTL and the RF input produce an intermediate frequency (IF) signal, that is provided to a receiver of the VNA.

As illustrated, the harmonic sampler outputs IF signal IFa (or reference IF), which is carried back to the VNA. Further, the RF signal is output to the DUT, and the received or returned signal is coupled to the sampler and the sampler output IF signal IFb (or test IF) is carried back to the VNA, enabling measurement of the electrical response of the DUT. Buffer amplifiers are included to buffer and impedance transform the IF signals for a sampler chip, buffering the signal lines from input to output rather than amplifying the IF signals. The electrical and thermal performance of the setup is largely independent of the tether length. This independence is achieved by varying the gain/output power of the amplifiers residing in a thermally managed control box.

Referring again to FIG. 2A, in accordance with an embodiment, the VNA can comprise a thermally managed control box that includes additional amplification stage(s) that amplify the RF signal, which is then transmitted along the tether to the module. As noted above, RF signals transmitted by a measuring instrument such as a VNA and propagating along transmission lines lose power over long distances. As further noted, in prior art systems amplification of transmitted signals occurs in band limited amplifiers specific to source chains to provide appropriate circuits for the target frequency ranges of the source chains.

An additional amplification stage for amplifying signals transmitted to modules in accordance with the prior art would not have been possible due to the broadband frequency range of the module and the unavailability of a suitable power amplifier for amplifying all frequency across the broadband frequency range, thus the inclusion of power amplifiers within the modules for amplifying signals propagated to the distributed harmonic generators. The relatively larger base VNA becomes the heat dissipative device, which can handle heat dissipating components that generate relatively large watts and thermal power.

In accordance with an embodiment, the VNA is coupled via the tether to a narrowband module, allowing use at the VNA of an amplifier stage (or stages) that is usable with the narrowband frequency range of the module. A result is an amplified signal that can be transmitted over a longer length of tether having sufficient power at the module to generate test signals for transmission to a DUT.

Modules and circuits in accordance with embodiments of the present invention are usable in near/farfield measurements of antennas for 5G channel sounding, backhaul, automotive radar, etc., and low cost and enhanced measurement throughput of waveguide components in manufacturing environments, etc.

Figure 3:
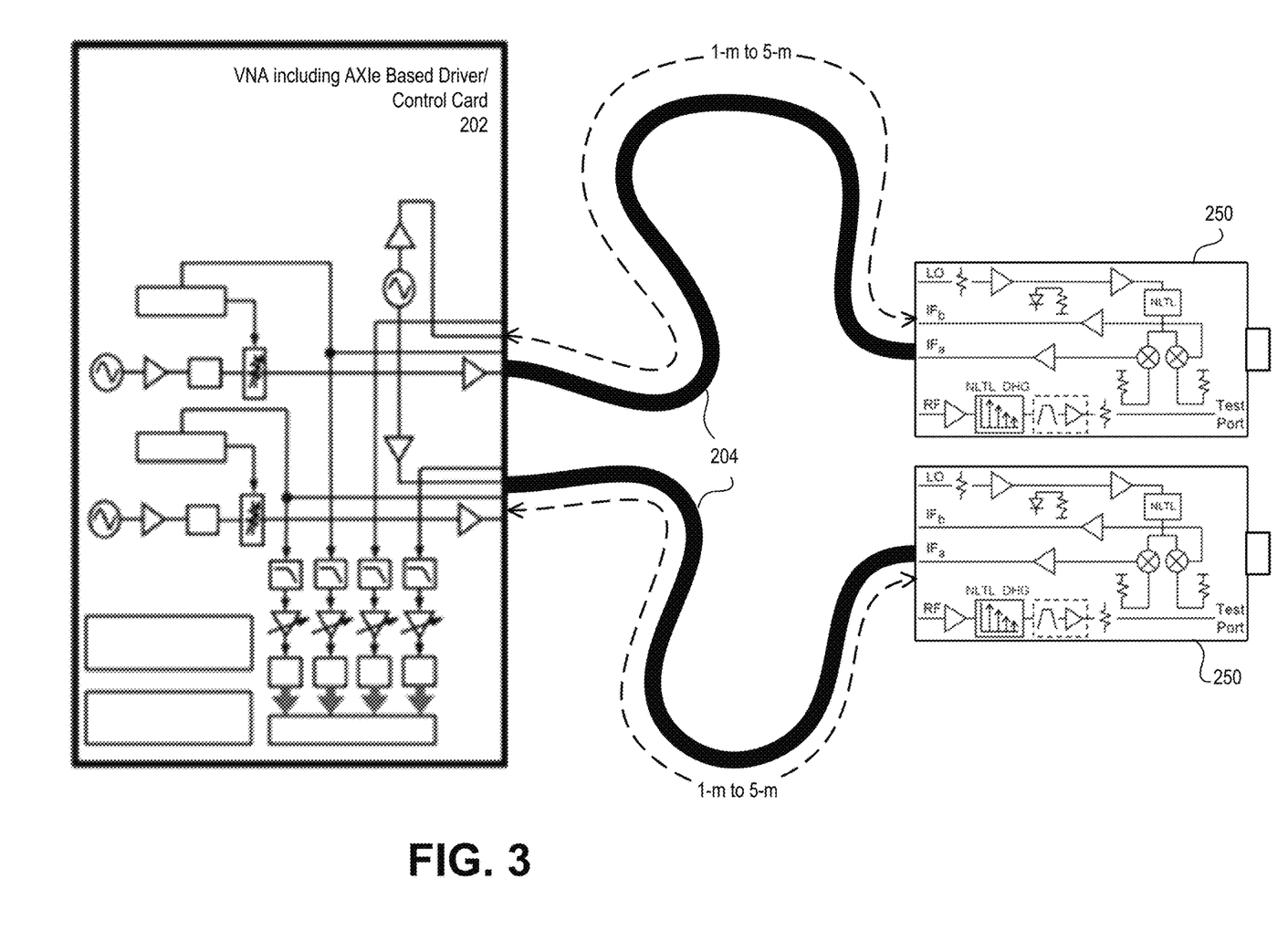
FIG. 3 is a circuit diagram of a pair of modules connected with a vector network analyzer (VNA) via an AXIe card for use in measuring the electrical response of a DUT, in accordance with another embodiment.

FIG. 3 illustrates a system for measuring an electrical response of a DUT to test signals in the mm-wave spectrum range, in accordance with another embodiment of the present invention. As shown, the system comprises a VNA 202 including a AXIe-based driver/control card 202. The VNA is a two-port E-band VNA with 1-meter- or 5-meter-long tethers and a pair of NLTL-based reflectometers are controlled by the AXIe card housed in a 3-U-high (rack unit) box. As can be seen, the VNA includes amplifiers for amplifying signals transmitted by the VNA. The system further comprises the pair of modules 250, each connected to the VNA by a tether 204. Using a pair of modules connected with a DUT, both reverse and forward scattering (S-) parameters can be measured for the DUT.

As shown the modules in the embodiment of FIG. 3 each include an amplifier for amplifying an RF signal received from the VNA prior to propagating the RF signal to a distributed harmonic generator. In such an embodiment, an amplifier within the module can provide some amplification to the incoming signals, while operating at much lower powers with much less heat dissipation due to the RF signal being amplified prior to transmission from the VNA. Thus, in some embodiments, RF signals generated at the VNA can be amplified both at the VNA and at the module, with the selection of amplifiers and design of the module being determined based on trade-offs in size, weight, test signal power at the test port, frequency range of the RF signals generated by the VNA, etc.

Figure 4:
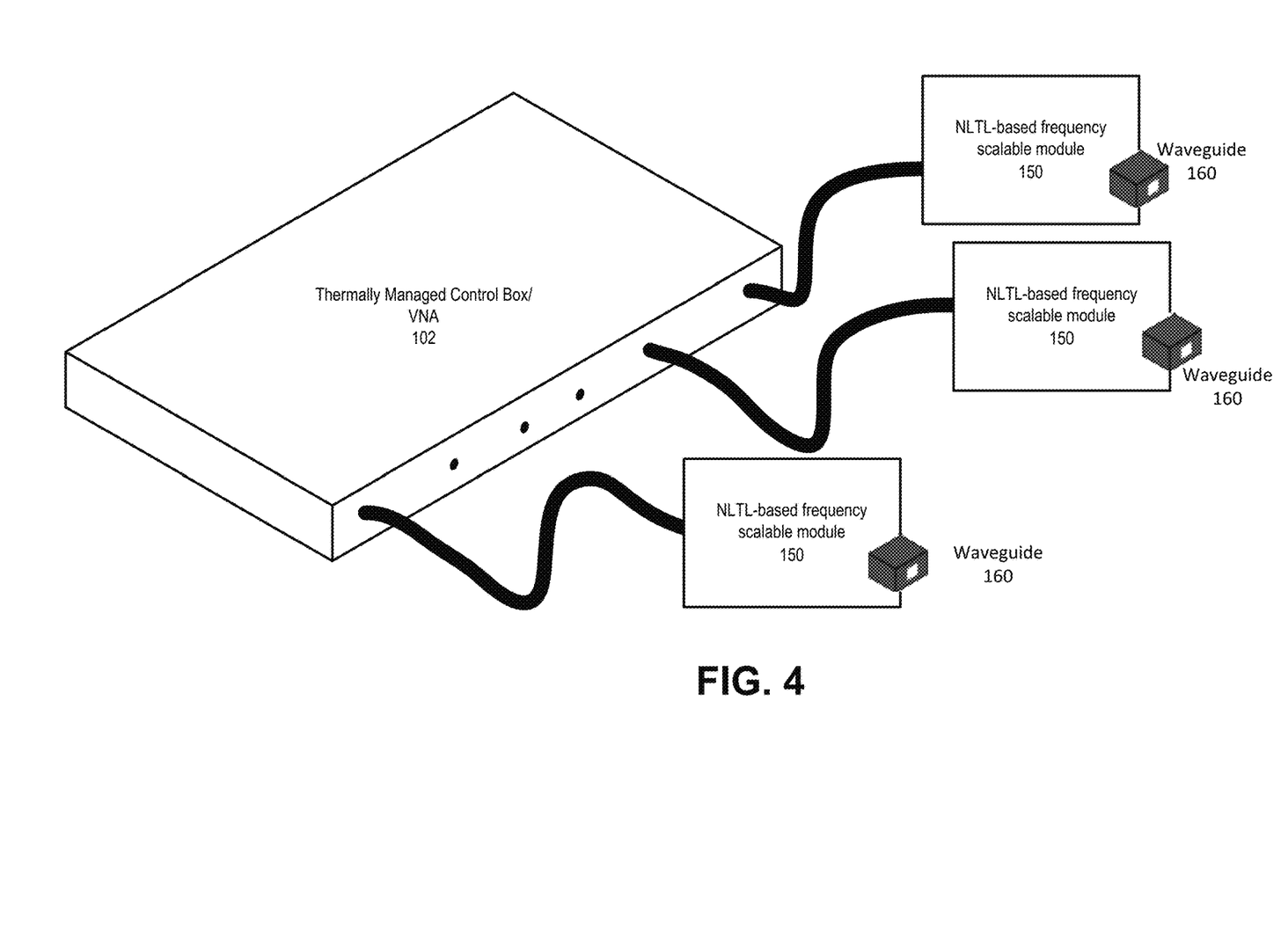
FIG. 4 is a block diagram of a plurality of modules connected with respective ports of a VNA, in accordance with another embodiment.

FIG. 4 is a block diagram of a system in accordance with a further embodiment of the present invention. As can be seen, the system comprises a multi-port, thermally managed control box of a VNA 102. As can be seen, the VNA includes three ports each connected via a tether 104 having a scalable length with a module 150 that can be connected with a DUT via a waveguide 160. Each port of the VNA outputs an RF signal that is amplified via an amplification stage (or stages) prior to transmission to the module via the tether. The VNA can include an arbitrary number of test ports, and as shown includes six test ports for measuring S-parameters. One of ordinary skill in the art will appreciate that embodiments In accordance with embodiments, a module as described above provide a miniature, thermally efficient mm-wave reflectometer module with scalable tether length. The small module size, nearly constant temperature, and electrical performance are achieved by locating heat-generating driver amplifiers in a thermally managed control box located at the opposite end of the tether. Elements of the invention include tether length scalability, making a slew of single and multi-port mm-wave measurement scenarios possible at low cost (e.g., near/far-field antenna measurements, static channel sounding, automatic test equipment (ATE) testing of waveguide components, etc.), long term stability for enhanced measurement throughput, reduced hardware cost and complexity, etc.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A system comprising a reflectometer, for measuring an electrical response of a device under test (DUT), the reflectometer module comprising:
   an input port for connecting the reflectometer module via a tether to a radio frequency (RF) source and receiving a radio frequency (RF) signal;
   a test port for connecting the reflectometer to a device under test (DUT);
   a distributed harmonic generator connected to the input port, wherein the RF signal from the input drives the distributed harmonic generator to multiply the RF signal and generate a test signal having a frequency in the millimeter wave range;

an amplifier connected to the distributed harmonic generator and configured to amplify the test signal generated by the distributed harmonic generator;

a signal path connecting the amplifier to the output port, wherein the amplifier provides the amplified test signal through the signal path to the output port;

a sampler coupled to the signal path, wherein the sampler comprises, a sampler input connectable with an local oscillator (LO) source to receive a LO signal, a non-linear transmission line (NLTL) for receiving the LO signal and generating pulses at a frequency in the millimeter wave range, wherein the sampler is configured to receive an input signal from the DUT in response to the test signal, wherein the response signal is in the millimeter wave range, wherein the sampler is configured to generate an intermediate frequency (IF) signal from the response signal using the pulse generated by the NLTL, and wherein the sampler outputs the IF an signal via the tether to a receiver of a measuring instrument.

2. The system of claim 1, further comprising:

a tether connectable between the reflectometer module and a measuring instrument to carry the LO signal and the RF signal from the measuring instrument to the reflectometer module and carry the IF signal from the reflectometer module to the measuring instrument.

3. The system of claim 2, further comprising:

a vector network analyzer (VNA) connectable with the reflectometer module at a port via the tether and providing an RF signal to the reflectometer module; and wherein the VNA includes an amplifier stage for amplifying the RF signal prior to transmitting the RF signal at the port.

4. A system for measuring an electrical response of a device under test (DUT), comprising:

a vector network analyzer (VNA) having a radio frequency source, a receiver, and a port for transmitting RF signal;

a reflectometer module with reduced heat dissipation, the reflectometer module being connectable with the VNA and including an input port for connecting the reflectometer module via a tether to the radio frequency (RF) source and receiving the radio frequency (RF) signal from the VNA, a test port for connecting the reflectometer module to the DUT, a distributed harmonic generator connected to the input port, wherein the RF signal from the input drives the distributed harmonic generator to multiply the RF signal and generate a test signal having a frequency in the millimeter wave range, an amplifier connected to the distributed harmonic generator and configured to amplify the test signal generated by the distributed harmonic generator, a signal path connecting the amplifier to the output port, wherein the amplifier provides the amplified test signal through the signal path to the output port, a sampler coupled to the signal path, wherein the sampler comprises, a sampler input connectable with an local oscillator (LO) source to receive a LO signal, a non-linear transmission line (NLTL) for receiving the LO signal and generating pulses at a frequency in the millimeter wave range, wherein the sampler is configured to receive an input signal from the DUT in response to the test signal, wherein the response signal is in the millimeter wave range, wherein the sampler is configured to generate an intermediate frequency (IF) signal from the response signal using the pulse generated by the NLTL, and wherein the sampler outputs the IF signal via the tether to the receiver of the VNA;

a tether for connecting the reflectometer module to the VNA via the port to carry the LO signal and the RF signal from the VNA to the reflectometer module and the IF signal from the reflectometer module to the VNA.

5. The system of claim 4, wherein the VNA comprises an amplifier stage for amplifying the RF signal prior to transmitting the RF signal to the reflectometer module.

6. The system of claim 4, wherein the VNA comprises an amplifier stage for amplifying the RF signal prior to transmitting the RF signal to the reflectometer module in order to compensate for signal losses in tethers having different lengths.

7. The system of claim 4, wherein the VNA comprises a thermally managed amplifier stage for amplifying the RF signal prior to transmitting the RF signal to the reflectometer module.

8. The system of claim 4, wherein the VNA comprises amplifier stage for amplifying the RF signal in a narrowband frequency range of the reflectometer module prior to transmitting the RF signal to the reflectometer module whereby the amplified RF signal can be transmitted over a longer length of tether while having sufficient power at the reflectometer module to generate test signals for transmission to the DUT.

9. The system of claim 4, wherein the tether is fiver meters long and the VNA comprises amplifier stage for amplifying the RF signal in a narrowband frequency range of the reflectometer module prior to transmitting the RF signal to the reflectometer module whereby the amplified RF signal can be transmitted over the five meter long tether while having sufficient power at the reflectometer module to generate test signals for transmission to the DUT.

10. A system for measuring an electrical response of a device under test (DUT), comprising:

a vector network analyzer (VNA) having a radio frequency source, a LO source for transmitting a LO signal, a receiver, and a port for transmitting an RF signal;

a reflectometer module;

a tether which connects the reflectometer module to the VNA to carry the LO signal and the RF signal from the VNA to the reflectometer module and an IF signal from the reflectometer module to the VNA;

wherein the reflectometer module comprises, an input port for connecting the reflectometer module via a tether to the radio frequency (RF) source and receiving the radio frequency (RF) signal from the VNA, a test port for connecting the reflectometer module to the DUT, a distributed harmonic generator connected to the input port, wherein the RF signal from the input drives the distributed harmonic generator to multiply the RF signal and generate a test signal having a frequency in the millimeter wave range, an amplifier connected to the distributed harmonic generator and configured to amplify the test signal generated by the distributed harmonic generator, a signal path connecting the amplifier to the output port, wherein the amplifier provides the amplified test signal through the signal path to the output port, a sampler coupled to the signal path, wherein the sampler comprises,     a sampler input connectable with an local oscillator (LO) source to receive a LO signal,     a non-linear transmission line (NLTL) for receiving the LO signal and generating pulses at a frequency in the millimeter wave range,     wherein the sampler is configured to receive an input signal from the DUT in response to the test signal, wherein the response signal is in the millimeter wave range,     wherein the sampler is configured to generate an intermediate frequency (IF) signal from the response signal using the pulse generated by the NLTL, and     wherein the sampler outputs the IF signal via the tether to the receiver of the VNA.

11. The system of claim 10, wherein the VNA comprises an amplifier stage for amplifying the RF signal prior to transmitting the RF signal to the reflectometer module.

12. The system of claim 10, wherein the VNA comprises an amplifier stage for amplifying the RF signal prior to transmitting the RF signal to the reflectometer module in order to compensate for signal losses in tethers having different lengths.

13. The system of claim 10, wherein the VNA comprises a thermally managed amplifier stage for amplifying the RF signal prior to transmitting the RF signal to the reflectometer module.

14. The system of claim 10, wherein the VNA comprises amplifier stage for amplifying the RF signal in a narrowband frequency range of the reflectometer module prior to transmitting the RF signal to the reflectometer module whereby the amplified RF signal can be transmitted over a longer length of tether while having sufficient power at the reflectometer module to generate test signals for transmission to the DUT.

15. The system of claim 10, wherein the tether is five meters long and the VNA comprises amplifier stage for amplifying the RF signal in a narrowband frequency range of the reflectometer module prior to transmitting the RF signal to the reflectometer module whereby the amplified RF signal can be transmitted over the five meter long tether while having sufficient power at the reflectometer module to generate test signals for transmission to the DUT.

* * * * *